United States Patent
Finol et al.

(10) Patent No.: US 6,868,431 B1
(45) Date of Patent: Mar. 15, 2005

(54) CIRCUIT AND METHOD FOR PROCESSING DATA

(75) Inventors: Jesus L. Finol, Gilbert, AZ (US); Mark J. Chambers, Gilbert, AZ (US); Albert H. Higashi, Lawrenceville, GA (US); James B. Phillips, North Richland Hills, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 09/426,670

(22) Filed: Oct. 25, 1999

(51) Int. Cl.[7] ............................................. G06F 17/10
(52) U.S. Cl. ..................................... 708/300; 708/307
(58) Field of Search .............................. 708/300, 313, 708/319, 308, 707

(56) References Cited

U.S. PATENT DOCUMENTS

| | | | |
|---|---|---|---|
| 3,825,831 A | | 7/1974 | Ishiguro |
| 3,921,204 A | | 11/1975 | Thompson |
| 4,008,435 A | | 2/1977 | Oshima et al. ............ 325/38 B |
| 4,314,105 A | | 2/1982 | Mozer ................ 179/155.55 R |
| 5,031,132 A | * | 7/1991 | Dolazza ...................... 708/308 |
| 5,212,659 A | * | 5/1993 | Scott et al. .................. 708/313 |
| 5,235,334 A | | 8/1993 | Manvar |
| 5,511,015 A | * | 4/1996 | Flockencier ................ 708/420 |
| 5,541,864 A | * | 7/1996 | Van Bavel et al. ......... 708/313 |
| 5,729,483 A | | 3/1998 | Brown |
| 6,311,201 B1 | * | 10/2001 | Albright ...................... 708/313 |

* cited by examiner

Primary Examiner—Chuong Dinh Ngo
(74) Attorney, Agent, or Firm—Michael P. Noonan

(57) ABSTRACT

A Finite Impulse Response (FIR) filter circuit (60) includes delay elements (63, 64, 66), multipliers (71, 72, 73, 74), a summing device (78), and a digital integrator (69) at the output of the FIR filter circuit (60). A method for processing data using the FIR filter circuit (60) includes differentially encoding data prior to storing or processing of the data. The method provides a technique for compressing data since less memory is needed to store derivative data. The method further includes integrating the derivative data using the digital integrator (69) to decompress the derivative data.

14 Claims, 2 Drawing Sheets

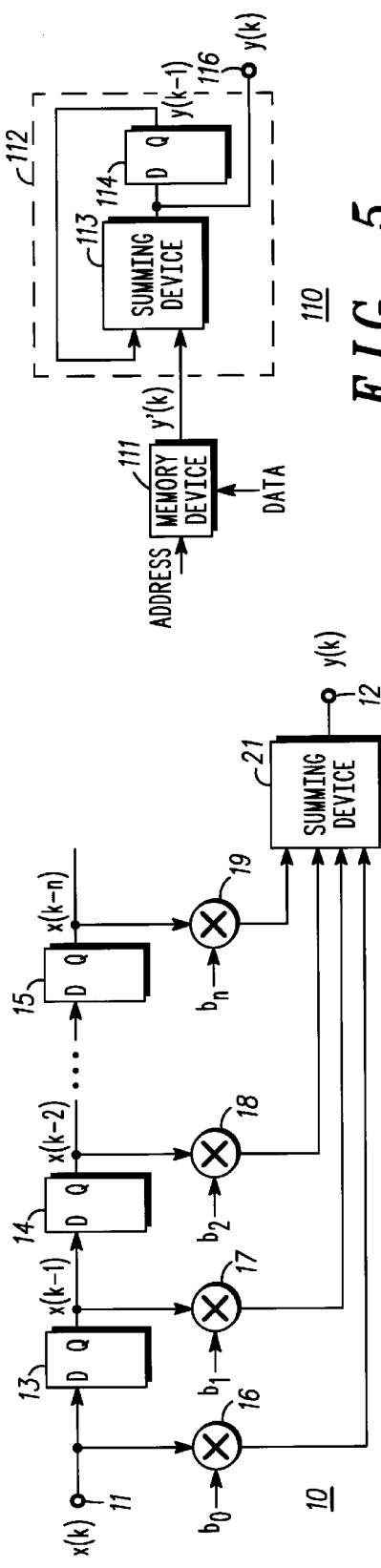
-PRIOR ART-
FIG. 1
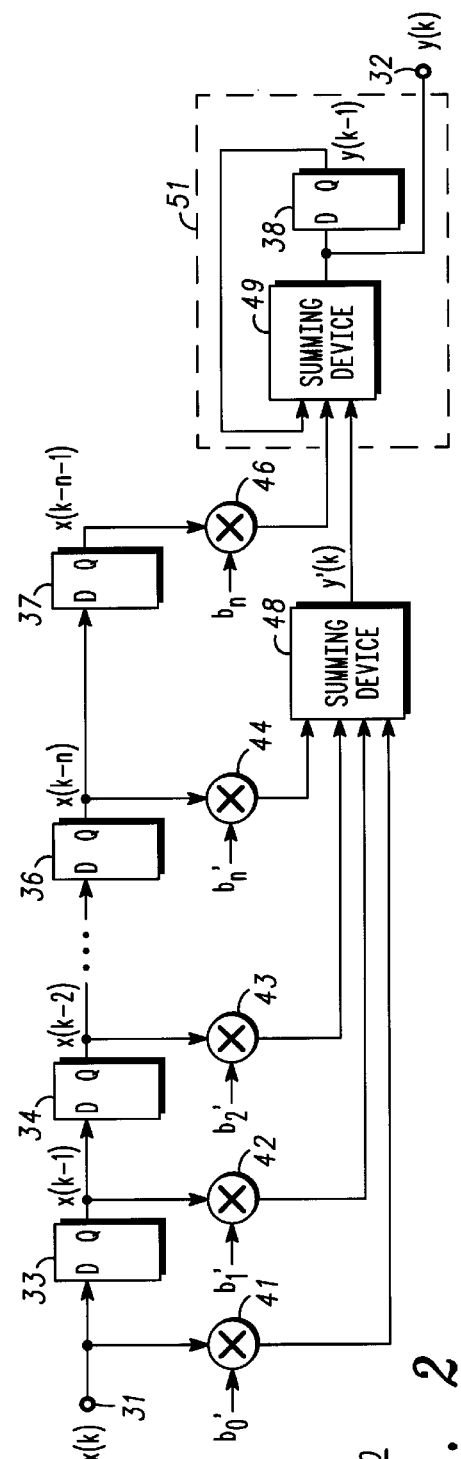
FIG. 5
FIG. 2

CIRCUIT AND METHOD FOR PROCESSING DATA

FIELD OF THE INVENTION

The present invention relates, in general, to circuits and, more particularly, to circuits for processing digital data.

BACKGROUND OF THE INVENTION

Digital filters are used in communication systems and computer systems. For example, digital filters are used in data converters such as Analog-to-Digital Converters (ADCs). There are two basic types of digital filters, non-recursive or Finite Impulse Response (FIR) filters and recursive or Infinite Impulse Response (IIR) filters.

The number of digital logic gates in a digital filter is directly proportional to the size of the impulse response (i.e., total number of digital filter coefficients) and the desired bit resolution of the digital filter. Reducing the number of logic gates in a digital filter decreases the die size and power consumption of a digital filter. However, this results in degradation of the bit resolution of the digital filter and can result in loss of information contained in the original data signal.

Accordingly, it would be advantageous to have a circuit and method for signal processing that reduces die size of the circuit without loss of information. It would be of further advantage for the circuit to be size and cost efficient.

BRIEF DESCRIPTION OF THE DRAWINGS

FIG. 1 is a block diagram of a prior art Finite Impulse Response (FIR) filter;

FIG. 2 is a block diagram of an FIR filter in accordance with a first embodiment of the present invention;

FIG. 5 is a block diagram of a circuit in accordance with a fourth embodiment of the present invention.

DETAILED DESCRIPTION OF THE DRAWINGS

Figure 3:
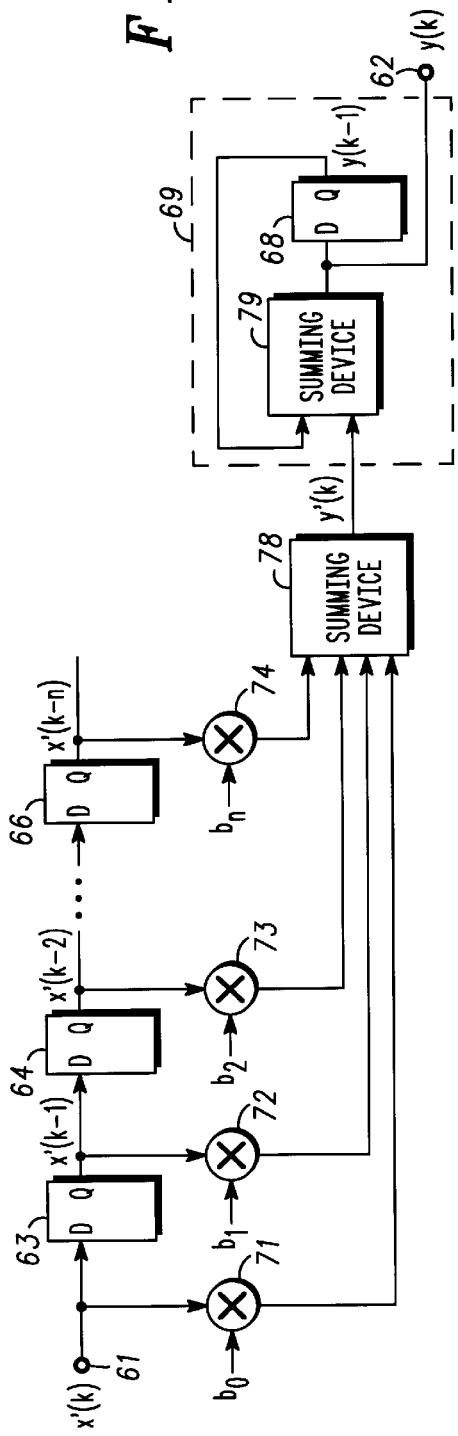
FIG. 3 is a block diagram of an FIR filter in accordance with a second embodiment of the present invention.

Generally, the present invention provides a circuit and method for processing digital data. The method of the present invention provides a technique for compressing data. In particular, the method includes differentially encoding data prior to storing or processing of the data. Data is differentially encoded by performing a mathematical derivative operation of the data to generate derivative data. Derivative data can be represented using fewer bits and smaller word sizes. Thus, less memory is needed to store the derivative data. Further, the summation, multiplication, and delay operations for processing derivative data operate on smaller word sizes, thereby decreasing the number of digital logic gates needed for processing and storing the derivative data. The method of the present invention further includes the step of integrating the derivative data to decompress the derivative data and retrieve the desired output information from the compressed derivative data.

FIG. 1 is a block diagram of a prior art Finite Impulse Response (FIR) filter 10. It should be noted that arrowheads are shown in the figures to indicate signal direction. Filter 10 has an input terminal 11 coupled for receiving a data signal labeled x(k) and an output terminal 12 for providing an output signal labeled y(k). Filter 10 includes delay elements 13, 14, and 15, multipliers 16, 17, 18, and 19, and a summing device 21.

Delay elements 13, 14, and 15 are D-type flips-flips each having a data input terminal labeled D and a true output terminal labeled Q. Terminal D of delay element 13 is coupled for receiving signal x(k). A first input terminal of multiplier 16 is coupled for receiving signal x(k) and a second input terminal of multiplier 16 is coupled for receiving a tap weight or coefficient signal labeled $b_0$. An output terminal of multiplier 16 is connected to a first input terminal of summing device 21. Multiplier 16 multiplies signal x(k) by signal $b_0$ to generate a first weighted signal that is transmitted from the output terminal of multiplier 16 to the first input terminal of summing device 21.

Terminal Q of delay element 13 is commonly connected to terminal D of delay element 14 and a first input terminal of multiplier 17. Delay element 13 delays signal x(k) and generates a delay signal labeled x(k−1). Delay signal x(k−1) is transmitted to terminal D of delay element 14 and to the first input terminal of multiplier 17. A second input terminal of multiplier 17 is coupled for receiving a coefficient signal labeled $b_1$. An output terminal of multiplier 17 is connected to a second input terminal of summing device 21. Multiplier 17 multiplies signal x(k−1) by signal $b_1$ to generate a second weighted signal that is transmitted from the output terminal of multiplier 17 to the second input terminal of summing device 21.

Terminal Q of delay element 14 is connected to a first input terminal of multiplier 18. Delay element 14 delays delay signal x(k−1) and generates a delay signal labeled x(k−2). Delay signal x(k−2) is transmitted from terminal Q of delay element 14 to the first input terminal of multiplier 18. A second input terminal of multiplier 18 is coupled for receiving a coefficient signal labeled $b_2$. An output terminal of multiplier 18 is connected to a third input terminal of summing device 21. Multiplier 18 multiplies signal x(k−2) by signal $b_2$ to generate a third weighted signal that is transmitted from the output terminal of multiplier 18 to the third input terminal of summing device 21.

FIR filter 10 can have N stages, wherein each stage includes a delay element and a multiplier. The size (i.e., the number of stages) of FIR filter 10 is proportional to the size of the impulse response (i.e., total number of coefficients) and the bit resolution of FIR filter 10.

Delay element 15 is the final stage of FIR filter 10. Terminal Q of delay element 15 is connected to a first input terminal of multiplier 19. Delay element 15 generates a delay signal labeled x(k−n). Delay signal x(k−n) is transmitted from terminal Q of delay element 15 to the first input terminal of multiplier 19. A second input terminal of multiplier 19 is coupled for receiving a coefficient signal labeled $b_n$. An output terminal of multiplier 19 is connected to a fourth input terminal of summing device 21. Multiplier 19 multiplies signal x(k−n) by signal $b_n$ to generate a fourth weighted signal that is transmitted from the output terminal of multiplier 19 to the fourth input terminal of summing device 21.

Summing device 21 sums the weighted signals at its input terminals to generate output signal y(k) at output terminal 12. Output signal y(k) is represented by equation 1.

$$y(k)=b_0 x(k)+b_1 x(k-1)+ \ldots +b_n x(k-n) \qquad (1)$$

where n is an integer

FIG. 2 is a block diagram of a FIR filter 30 in accordance with a first embodiment of the present invention. Filter 30 has an input terminal 31 coupled for receiving a data signal x(k) and an output terminal 32 for providing an output signal y(k). Filter 30 includes delay elements 33, 34, 36, 37, and 38, multipliers 41, 42, 43, 44, and 46, and summing devices 48 and 49. The delay elements, multipliers, and summing devices of FIR filter 30 are implemented using, for example, digital logic gates (not shown).

Delay elements 33, 34, 36, 37 and 38 are D-type flip-flops each having a data input terminal labeled D and a true output terminal labeled Q. Terminal D of delay element 33 is coupled for receiving signal x(k). A first input terminal of multiplier 41 is coupled for receiving signal x(k) and a second input terminal of multiplier 41 is coupled for receiving a tap weight or coefficient derivative signal labeled $b_0'$. An output terminal of multiplier 41 is connected to a first input terminal of summing device 48. Multiplier 41 multiplies signal x(k) by derivative signal $b_0'$ to generate a first weighted signal that is transmitted from the output terminal of multiplier 41 to the first input terminal of summing device 48.

Terminal Q of delay element 33 is commonly connected to terminal D of delay element 34 and a first input terminal of multiplier 42. Delay element 33 delays signal x(k) and generates a delay signal labeled x(k−1). Delay signal x(k−1) is transmitted from terminal Q of delay element 33 to terminal D of delay element 34 and to the first input terminal of multiplier 42. A second input terminal of multiplier 42 is coupled for receiving a derivative coefficient signal labeled $b_1'$. An output terminal of multiplier 42 is connected to a second input terminal of summing device 48. Multiplier 42 multiplies signal x(k−1) by derivative signal $b_1'$ to generate a second weighted signal that is transmitted from the output terminal of multiplier 42 to the second input terminal of summing device 48.

Terminal Q of delay element 34 is connected to a first input terminal of multiplier 43. Delay element 34 delays signal x(k−1) and generates a delay signal labeled x(k−2). Delay signal x(k−2) is transmitted from terminal Q of delay element 34 to the first input terminal of multiplier 43. A second input terminal of multiplier 43 is coupled for receiving a derivative coefficient signal labeled $b_2'$. An output terminal of multiplier 43 is connected to a third input terminal of summing device 48. Multiplier 43 multiplies signal x(k−2) by derivative signal $b_2'$ to generate a third weighted signal that is transmitted from the output terminal of multiplier 43 to the third input terminal of summing device 48.

Terminal Q of delay element 36 is commonly connected to terminal D of delay element 37 and a first input terminal of multiplier 44. Delay element 36 generates a delay signal labeled x(k−n). Delay signal x(k−n) is transmitted from terminal Q of delay element 36 to terminal D of delay element 37 and to the first input terminal of multiplier 44. A second input terminal of multiplier 44 is coupled for receiving a derivative coefficient signal labeled $b_n'$. An output terminal of multiplier 44 is connected to a fourth input terminal of summing device 48. Multiplier 44 multiplies signal x(k−n) by signal $b_n'$ to generate a fourth weighted signal that is transmitted from the output terminal of multiplier 44 to the fourth input terminal of summing device 48. An output terminal of summing device 48 is connected to a first input terminal of summing device 49.

Terminal Q of delay element 37 is connected to a first input terminal of multiplier 46. Delay element 37 delays signal x(k−n) and generates a delay signal labeled x(k−n−1). Delay signal x(k−n−1) is transmitted from terminal Q of delay element 37 to the first input terminal of multiplier 46.

A second input terminal of multiplier 46 is coupled for receiving a coefficient signal labeled $b_n$. An output terminal of multiplier 46 is connected to a second input terminal of summing device 49. Multiplier 46 multiplies signal x(k−n−1) by signal $b_n$ to generate a fifth weighted signal that is transmitted from the output terminal of multiplier 46 to the second input terminal of summing device 49.

An output terminal of summing device 49 is commonly connected to terminal D of delay element 38 and to output terminal 32. Terminal Q of delay element 38 is connected to a third input terminal of summing device 49.

Summing device 49 and delay element 38 serve as a digital integrator 51 for generating output signal y(k) from signal y'(k).

During operation, summing device 48 sums the weighted signals at its input terminals to generate output signal y'(k) at its output terminal. Summing device 48 is also referred to as an accumulator. Signal y'(k) is a summed derivative signal represented by equation 2.

$$y'(k)=b_0'x(k)+b_1'x(k-1)+\ldots+b_n'x(k-n) \qquad (2)$$

Derivative signals $b_0'$–$b_n'$ are represented by equation 3.

$$b_i'=b_i-b_{i-i} \qquad (3)$$

where i=0, 1, . . . N; $b_{-1}=0$

Substituting equation 3 into equation 2 produces equation 4.

$$y'(k)=b_0x(k)+(b_1-b_0)x(k-1)+\ldots(b_n-b_{n-1})x(k-n) \qquad (4)$$

Simplifying equation 4 produces equation 5.

$$y'(k)=y(k)-y(k-1)+b_nx(k-n-1) \qquad (5)$$

Solving for y(k) in equation 5 produces equation 6.

$$y(k)=y'(k)+y(k-1)-b_nx(k-n-1) \qquad (6)$$

Referring to equation 6 and FIG. 2, signal y(k) is generated by integrating y'(k) and subtracting a boundary condition of $b_n$x(k−n−1). The boundary condition of $b_n$x(k−n−1) is implemented using delay element 37 and multiplier 46. The output of multiplier 46 provides the boundary condition to the second input terminal of summing device 49. The second input terminal of summing device 49 is a negative input terminal for subtraction. FIR filter 30 includes integrator 51 as an output stage for integrating output signal y'(k). In other words, an integrator 51 is connected at the output of FIR filter 30 for integration of signal y'(k). Summing device 49 sums the boundary condition, signal y'(k), and signal y(k−1) to generate output signal y(k), which is transmitted to output terminal 32.

In this embodiment, compression of a waveform or data is achieved by differentiating the impulse response of filter 30, i.e., differentiating the coefficient signals processed by filter 30. Derivative coefficient signals $b_0'$, $b_1'$, $b_2'$, and $b_n'$ are generated by differentiating coefficient signals $b_0$, $b_1$, $b_2$, and $b_n$, respectively.

The derivative of a waveform has less amplitude variation than the original waveform. Therefore, the amplitude range of a derivative waveform can be represented with fewer bits or smaller word sizes than the amplitude range of the original waveform. Thus, less memory is needed to store the derivative waveform. In this embodiment, less memory is needed to store derivative signals $b_0'$, $b_1'$, $b_2'$, and $b_n'$ compared to storing coefficient signals $b_0$, $b_1$, $b_2$, $b_n$.

Further, the summation and multiplication operations of FIR filter 30 operate on smaller word sizes, thereby reducing the number of digital logic gates in FIR filter 30 compared to prior art FIR filter 10 (FIG. 1). Thus, the die area of FIR filter 30 is less than the die area of prior art FIR filter 10.

FIG. 3 is a block diagram of an FIR filter 60 in accordance with a second embodiment of the present invention. Filter 60 has an input terminal 61 coupled for receiving a derivative data signal x'(k) and an output terminal 62 for providing output signal y(k). Filter 60 includes delay elements 63, 64, 66, and 68, multipliers 71, 72, 73, and 74, and summing devices 78 and 79.

Terminal D of delay element 63 is coupled for receiving signal x'(k). A first input terminal of multiplier 71 is coupled for receiving signal x'(k) and a second input terminal of multiplier 71 is coupled for receiving coefficient signal $b_0$. An output terminal of multiplier 71 is connected to a first input terminal of summing device 78. Multiplier 71 multiplies derivative signal x'(k) by coefficient signal $b_0$ to generate a first weighted signal that is transmitted from the output terminal of multiplier 71 to the first input terminal of summing device 78.

Terminal Q of delay element 63 is commonly connected to terminal D of delay element 64 and a first input terminal of multiplier 72. Delay element 63 delays signal x'(k) and generates a delay signal labeled x'(k−1). Delay signal x'(k−1) is transmitted from terminal Q of delay element 63 to terminal D of delay element 64 and to the first input terminal of multiplier 72. A second input terminal of multiplier 72 is coupled for receiving coefficient signal $b_1$. An output terminal of multiplier 72 is connected to a second input terminal of summing device 78. Multiplier 72 multiplies signal x'(k−1) by signal $b_n$ to generate a second weighted signal that is transmitted from the output terminal of multiplier 72 to the second input terminal of summing device 78.

Terminal Q of delay element 64 is connected to a first input terminal of multiplier 73. Delay element 64 delays signal x'(k−1) and generates a delay signal labeled x'(k−2). Delay signal x'(k−2) is transmitted from terminal Q of delay element 64 to the first input terminal of multiplier 73. A second input terminal of multiplier 73 is coupled for receiving coefficient signal $b_2$. An output terminal of multiplier 73 is connected to a third input terminal of summing device 78. Multiplier 73 multiplies signal x'(k−2) by signal $b_2$ to generate a third weighted signal that is transmitted from the output terminal of multiplier 73 to the third input terminal of summing device 78.

Terminal Q of delay element 66 is connected to a first input terminal of multiplier 74. Delay element 66 generates a delay signal labeled x'(k−n). Delay signal x'(k−n) is transmitted from terminal Q of delay element 66 to the first input terminal of multiplier 74. A second input terminal of multiplier 74 is coupled for receiving coefficient signal $b_n$. An output terminal of multiplier 74 is connected to a fourth input terminal of summing device 78. Multiplier 74 multiplies signal x'(k−n) by signal $b_n$ to generate a fourth weighted signal that is transmitted from the output terminal of multiplier 74 to the fourth input terminal of summing device 78. An output terminal of summing device 78 is connected to a first input terminal of summing device 79.

An output terminal of summing device 79 is commonly connected to terminal D of delay element 68 and to output terminal 62. Terminal Q of delay element 68 is connected to a second input terminal of summing device 79.

Summing device 79 and delay element 68 serve as a digital integrator 69 for generating output signal y(k) from signal y'(k). Integrator 69 integrates signal y'(k) to generate the desired output signal y(k) at output terminal 62.

During operation, summing device 78 sums the weighted signals at its input terminals to generate signal y'(k) at its output terminal. Output signal y'(k) is represented by equation 7.

$$y'(k) = b_0 x'(k) + b_1 x'(k-1) + \ldots + b_n x'(k-n) \tag{7}$$

Derivative signal x'(i) is represented by equation 8.

$$x'(i) = x(i) - x(i-1) \tag{8}$$

where i = 0, 1, ... N

Substituting equation 8 into equation 7 produces equation 9.

$$y'(k) = b_0(x(k) - x(k-1)) + b_1(x(k-1) - x(k-2)) + \ldots b_n(x(k-n) - x(k-n-1)) \tag{9}$$

Simplifying equation 9 produces equation 10.

$$y'(k) = y(k) - y(k-1) \tag{10}$$

Solving for y(k) in equation 10 produces equation 11.

$$y(k) = y'(k) + y(k-1) \tag{11}$$

Referring to equation 11 and FIG. 3, FIR filter 60 includes digital integrator 69 as an output stage for integrating signal y'(k). Summing device 79 sums signal y'(k) and signal y(k−1) to generate output signal y(k), which is transmitted to output terminal 62.

Signal x'(k) is a derivative signal generated by differentiating data signal x(k). Derivative signal x'(k) has less amplitude variation than signal x(k). Thus, less memory is needed to store derivative signal x'(k). Further, the summation, multiplication, and delay operations of FIR filter 60 operate on smaller word sizes, thereby reducing the number of digital logic gates in FIR filter 60 compared to prior art FIR filter 10 (FIG. 1). Therefore, the die area of FIR filter 60 is less than the die area of prior art FIR filter 10 for processing data signal x(k) and coefficient signals $b_0$–$b_n$.

Figure 4:
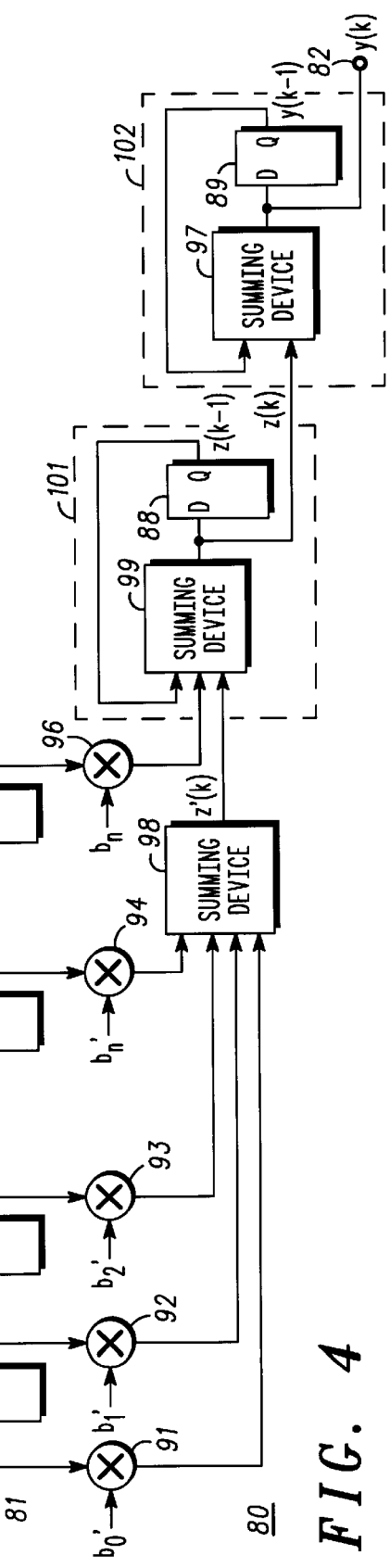
FIG. 4 is a block diagram of an FIR filter in accordance with a third embodiment of the present invention.

FIG. 4 is a block diagram of an FIR filter 80 in accordance with a third embodiment of the present invention. Filter 80 has an input terminal 81 coupled for receiving derivative data signal x'(k) and an output terminal 82 for providing output signal y(k). Filter 80 includes delay elements 83, 84, 86, 87, 88, and 89, multipliers 91, 92, 93, 94, and 96, and summing devices 97, 98, and 99.

Terminal D of delay element 83 is coupled for receiving signal x'(k). A first input terminal of multiplier 91 is coupled for receiving signal x'(k) and a second input terminal of multiplier 91 is coupled for receiving derivative coefficient signal $b_0'$. An output terminal of multiplier 91 is connected to a first input terminal of summing device 98. Multiplier 91 multiplies derivative signal x'(k) by derivative signal $b_0'$ to generate a first weighted signal that is transmitted from the output terminal of multiplier 91 to the first input terminal of summing device 98.

Terminal Q of delay element 83 is commonly connected to terminal D of delay element 84 and a first input terminal of multiplier 92. Delay element 83 delays signal x'(k) and generates a delay signal labeled x'(k−1). Delay signal x'(k−1) is transmitted from terminal Q of delay element 83 to terminal D of delay element 84 and to the first input terminal of multiplier 92. A second input terminal of multiplier 92 is coupled for receiving derivative coefficient signal $b_1'$. An output terminal of multiplier 92 is connected to a second input terminal of summing device 98. Multiplier 92 multiplies signal x'(k−1) by signal $b_1'$ to generate a second weighted signal that is transmitted from the output terminal of multiplier 92 to the second input terminal of summing device 98.

Terminal Q of delay element 84 is connected to a first input terminal of multiplier 93. Delay element 84 delays signal x'(k−1) and generates delay signal x'(k−2). Delay signal x'(k−2) is transmitted from terminal Q of delay element 84 to the first input terminal of multiplier 93. A second input terminal of multiplier 93 is coupled for receiving derivative coefficient signal $b_2'$. An output terminal of multiplier 93 is connected to a third input terminal of summing device 98. Multiplier 93 multiplies signal x'(k−2) by signal $b_2'$ to generate a third weighted signal that is transmitted from the output terminal of multiplier 93 to the third input terminal of summing device 98.

Terminal Q of delay element 86 is commonly connected to terminal D of delay element 87 and to a first input terminal of multiplier 94. Delay element 86 generates delay signal x'(k−n). Delay signal x'(k−n) is transmitted from terminal Q of delay element 86 to terminal D of delay element 87 and to the first input terminal of multiplier 94. A second input terminal of multiplier 94 is coupled for receiving derivative coefficient signal $b_n'$. An output terminal of multiplier 94 is connected to a fourth input terminal of summing device 98. Multiplier 94 multiplies signal x'(k−n) by signal $b_n'$ to generate a fourth weighted signal that is transmitted from the output terminal of multiplier 94 to the fourth input terminal of summing device 98. An output terminal of summing device 98 is connected to a first input terminal of summing device 99. Summing device 98 sums the weighted signals at its input terminals to generate signal z'(k) at its output terminal.

Terminal Q of delay element 87 is connected to a first input terminal of multiplier 96. Delay element 87 delays signal x'(k−n) and generates a delay signal labeled x'(k−n−1). Delay signal x'(k−n−1) is transmitted from terminal Q of delay element 87 to the first input terminal of multiplier 96. A second input terminal of multiplier 96 is coupled for receiving a coefficient signal $b_n$. An output terminal of multiplier 96 is connected to a second input terminal of summing device 99. Multiplier 96 multiplies signal x'(k−n−1) by signal $b_n$ to generate a fifth weighted signal that is transmitted from the output terminal of multiplier 96 to the second input terminal of summing device 99.

An output terminal of summing device 99 is commonly connected to terminal D of delay element 88 and to a first input terminal of summing device 97. Terminal Q of delay element 88 is connected to a third input terminal of summing device 99.

An output terminal of summing device 97 is commonly connected to terminal D of delay element 89 and to output terminal 82. Terminal Q of delay element 89 is connected to a second input terminal of summing device 97.

Summing device 99 and delay element 88 serve as a digital integrator 101 and summing device 97 and delay element 89 serve as a digital integrator 102. Together, integrators 101 and 102 provide a double integration function for generating output signal y(k) from signal z'(k).

Signal z'(k) is represented by equation 12.

$$z'(k)=b_0'x'(k)+b_1'x'(k-1)+ \ldots +b_n'x'(k-n) \tag{12}$$

Derivative signal z'(i) is represented by equation 13.

$$z'(i)=z(i)-z(i-1) \tag{13}$$

where i=0, 1, ... n

Derivative signals $b_0'-b_n'$ are represented by equation 14.

$$b_i'=b_i-b_{i-1} \tag{14}$$

where i=0, 1, ... n; $b_{-1}=0$

Substituting equation 14 into equation 12 produces equation 15.

$$z'(k)=b_0x'(k)+(b_1-b_0)x'(k-1)+ \ldots (b_n-b_{n-1})x'(k-n) \tag{15}$$

z(k) is defined in equation 16.

$$z(k)=b_0x'(k)+b_1x'(k-1)+ \ldots b_nx'(k-n) \tag{16}$$

Combining and simplifying equations 15 and 16 produces equation 17.

$$z'(k)=z(k)-z(k-1)+b_nx'(k-n-1) \tag{17}$$

Solving for z(k) in equation 17 produces equation 18.

$$z(k)=z'(k)+z(k-1)-b_nx'(k-n-1) \tag{18}$$

Signal y(k) is generated from signal z(k) by integrating signal z(k). Equation 19 represents the relationship between y(k) and z(k).

$$y(k)=z(k)+y(k-1) \tag{19}$$

Substituting z(k) from equation 18 into equation 19 produces equation 20.

$$y(k)=z'(k)+z(k-1)-b_nx'(k-n-1)+y(k-1) \tag{20}$$

Referring to equation 20 and FIG. 4, signal y(k) is generated from signal z'(k) by first integrating z'(k) and subtracting a boundary condition of $b_nx'(k-n-1)$ to produce signal z(k) at the output terminal of summing device 99. Next, signal z(k) is integrated to produce signal y(k) at output terminal 82.

The boundary condition of $b_nx'(k-n-1)$ is implemented using delay element 87 and multiplier 96. The output of multiplier 96 provides the boundary condition to the second input terminal of summing device 99, which is a negative input terminal for subtraction. FIR filter 80 includes integrator 101 for integrating signal z'(k) and includes integrator 102 for integrating signal z(k). Summing device 99 sums the boundary condition, signal z'(k), and signal z(k−1) to generate signal z(k). Summing device 97 sums signal z(k) and signal y(k−1) to generate output signal y(k), which is transmitted to output terminal 82.

In the embodiment of FIG. 4, compression of data is achieved by differentiating input data signal x(k) and differentiating coefficient signals $b_0$, $b_1$, $b_2$, and $b_n$. Less memory is needed to store derivative data signal x'(k) and derivative coefficient signals $b_0'$, $b_1'$, $b_2'$, and $b_n'$. Further, the summation, multiplication, and delay operations of FIR filter 80 operate on smaller word sizes, thereby reducing the number of digital logic gates in FIR filter 80 compared to prior art FIR filter 10 (FIG. 1). Therefore, the die area of FIR filter 80 is less than the die area of prior art FIR filter 10 for processing data signal x(k) and coefficient signals $b_0$, $b_1$, $b_2$, and $b_n$.

FIG. 5 is a block diagram of a circuit 110 in accordance with a fourth embodiment of the present invention. Circuit 110 includes a memory device 111 and a digital integrator 112. Memory device 111 can be a volatile memory device such as a Random Access Memory (RAM) device or a nonvolatile memory device such as a Read Only Memory (ROM) device. Memory device 111 has a first input coupled for receiving an address signal labeled ADDRESS, a second input coupled for receiving a data signal labeled DATA, and an output for providing a derivative output signal y'(k).

Digital integrator 112 includes a summing device 113 and a delay element 114. A first input terminal of summing device 113 is connected to the output terminal of memory device 111 for receiving signal y'(k). An output terminal of summing device 113 is commonly connected to terminal D of delay element 114 and to an output terminal 116 for providing a nonderivative output signal y(k). Delay element 114 delays signal y(k) and generates delay signal y(k−1). Terminal Q of delay element 114 is connected to a second input terminal of summing device 113 for providing delay signal y(k−1).

Circuit 110 employs the differential encoding method of the present invention for compression of data. Derivative data is stored in memory device 111. As discussed hereinbefore, less memory is needed to store derivative data, thereby reducing the die size of memory device 111. The reduction in memory size depends on data signal characteristics and sampling frequency. A designer can choose the desired sampling frequency for a particular waveform in order to optimize memory size and die area.

The desired nonderivative signal y(k) is generated by integrating derivative signal y'(k) using digital integrator 112. That is, integrator 112 integrates derivative signal y'(k) to generate signal y(k). Summing device 49 sums signals y'(k) and y(k−1) to generate output signal y(k), which is transmitted to output terminal 116.

Circuit 110 can be used to implement a FIR filter, wherein the FIR filter comprises memory device 111, 10 digital integrator 112, and a microprocessor (not shown). The delay, multiplication, and summation operations for processing data signal x(k) and derivative signals $b_n'$–$b_n'$ to generate signal y'(k) can be performed using a microprocessor. After computation of y'(k) by the microprocessor, signal y'(k) is transmitted to memory device 111. Signal y'(k) is retrieved from memory device 111 and transmitted to digital integrator 112, which integrates signal y'(k) to generate the desired output signal y(k) at output terminal 116.

Although the present invention has been illustrated as a digital FIR filter, this is not a limitation of the present invention. The differential encoding method of the present invention can be implemented using an Infinite Impulse Response (IIR) filter. Further, the method of storing differentially encoded data can be used in any application requiring storage of data, wherein data is differentiated prior to storage in a memory device. Then, the stored derivative data is integrated to obtain the desired output data.

By now it should be appreciated that a signal processing circuit and method for processing data using a differential encoding technique have been provided. The method of the present invention includes differentiating data prior to storage or processing of the data followed by a step of integrating the differential data to obtain the desired nonderivative output signal. Less storage is needed for storing the differential data and less digital logic is needed for processing the differential data.

What is claimed is:

1. A circuit, comprising:
    a digital filter configured to receive an input signal, to differentiate the input signal to generate a derivative signal having fewer bits than the input signal, and to provide a differential output signal as a function of the differentiated input signal and of a series of coefficients; and
    a digital integrator having an input coupled to the output of the digital filter to receive the differential output signal from the digital filter, wherein the integrator is configured to integrate the differential output signal to produce an output signal and to provide the output signal at an output.

2. The circuit of claim 1, wherein the digital filter is a Finite Impulse Response (FIR) filter.

3. The circuit of claim 2, wherein the digital integrator includes:
    a summing device having a first input coupled to the output of the digital filter, a second input, and an output; and
    a delay element having an input coupled to the output of the summing device and an output coupled to the second input of the summing device.

4. The circuit of claim 1, further including a second digital integrator having an input coupled to the output of the digital integrator and an output.

5. The circuit of claim 4, wherein the second digital integrator includes:
    a summing device having a first input coupled to the output of the digital integrator, a second input, and an output; and
    a delay element having an input coupled to the output of the summing device and an output coupled to the second input of the summing device.

6. The circuit of claim 1, wherein the digital filter includes:
    a first delay element having an input coupled to the input of the digital filter and an output;
    a first multiplier having a first input coupled to the input of the first delay element, a second input coupled for receiving a first coefficient signal, and an output;
    a second multiplier having a first input coupled to the output of the first delay element, a second input coupled for receiving a second coefficient signal, and an output; and
    a summing device having a first input coupled to the output of the first multiplier, a second input coupled to the output of the second multiplier, and an output coupled to the input of the digital integrator.

7. The circuit of claim 6, wherein the digital filter further includes:
    a second delay element having an input coupled to the output of the first delay element and an output; and
    a third multiplier having a first input coupled to the output of the second delay element, a second input coupled for receiving a third coefficient signal, and an output coupled to a second input of the digital integrator.

8. The circuit of claim 6, wherein the digital filter further includes:
    a second delay element having an input coupled to the output of the first delay element and an output; and
    a third multiplier having a first input coupled to the output of the second delay element, a second input coupled for receiving a third coefficient signal, and an output coupled to a third input of the summing device.

9. The circuit of claim 1, wherein the digital filter comprises a memory device having an output coupled to the input of the digital integrator for providing a derivative signal.

10. A method for processing an input signal, comprising the steps of:
    differentiating the input signal to generate a derivative signal having fewer bits than the input signal;
    processing the derivative signal to generate a first output signal, wherein the step of processing includes the step of delaying the input signal to generate a delayed signal; and
    integrating the first output signal to generate a second output signal.

11. The method of claim 10, further including the step of storing the derivative signal.

12. The method of claim 10, wherein the step of processing her includes the steps of:

multiplying the derivative signal by a first coefficient signal to generate a first weighted signal;

multiplying the delayed signal by a second coefficient signal to generate a second weighted signal; and summing the first weighted signal and the second weighted signal to generate the first output signal.

13. The method of claim 10, further including the step of integrating the second output signal to generate a third output signal.

14. The method of claim 10, wherein the step of integrating includes the steps of:

delaying the second output signal to generate a second delayed signal; and summing the second delayed signal and the first output signal to generate the second output signal.

* * * * *

UNITED STATES PATENT AND TRADEMARK OFFICE
CERTIFICATE OF CORRECTION

PATENT NO. : 6,868,431 B1 Page 1 of 1
APPLICATION NO. : 09/426670
DATED : March 15, 2005
INVENTOR(S) : Jesus Lucidio Finol It is certified that error appears in the above-identified patent and that said Letters Patent is hereby corrected as shown below:

In Column 10, Line 67,

Change "her" to --further--

Signed and Sealed this

Ninth Day of September, 2008

JON W. DUDAS
*Director of the United States Patent and Trademark Office*